(12) United States Patent
Naulleau

(10) Patent No.: US 6,927,887 B2
(45) Date of Patent: *Aug. 9, 2005

(54) HOLOGRAPHIC ILLUMINATOR FOR SYNCHROTRON-BASED PROJECTION LITHOGRAPHY SYSTEMS

(75) Inventor: Patrick P. Naulleau, Oakland, CA (US)

(73) Assignee: EUV LLC, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/981,500

(22) Filed: Oct. 16, 2001

(65) Prior Publication Data

US 2003/0072046 A1 Apr. 17, 2003

(51) Int. Cl.$^7$ ................................. G02B 5/32
(52) U.S. Cl. ..................... 359/15; 359/599; 359/223; 355/67
(58) Field of Search ................ 359/15, 566, 197, 359/212, 223, 569, 572, 575, 599; 362/257; 355/44, 45, 53, 55, 67, 71, 77; 250/492.1, 492.2, 492.22, 492.23; 430/311, 312, 313; 378/34, 35, 503; 315/503

(56) References Cited

U.S. PATENT DOCUMENTS

| | | | | |
|---|---|---|---|---|
| 4,945,551 A | * | 7/1990 | Makabe et al. | 378/34 |
| 5,365,354 A | * | 11/1994 | Jannson et al. | 359/15 |
| 5,510,230 A | | 4/1996 | Tennant et al. | |
| 5,512,759 A | * | 4/1996 | Sweatt | 250/492.1 |
| 5,631,721 A | * | 5/1997 | Stanton et al. | 355/67 |
| 5,684,566 A | * | 11/1997 | Stanton | 355/67 |
| 5,825,448 A | * | 10/1998 | Bos et al. | 349/128 |
| 5,920,380 A | | 7/1999 | Sweatt | |
| 6,033,079 A | | 3/2000 | Hudyma | |
| 6,072,852 A | | 6/2000 | Hudyma | |
| 6,081,381 A | * | 6/2000 | Shalapenok et al. | 359/619 |
| 6,084,938 A | | 7/2000 | Hara et al. | |
| 6,118,559 A | * | 9/2000 | Kathman et al. | 359/9 |
| 6,183,095 B1 | | 2/2001 | Hudyma | |
| 6,188,513 B1 | | 2/2001 | Hudyma | |
| 6,198,793 B1 | | 3/2001 | Schultz et al. | |
| 6,226,346 B1 | | 5/2001 | Hudyma | |
| 6,262,836 B1 | | 7/2001 | Hudyma et al. | |
| 6,768,567 B2 | * | 7/2004 | Naulleau | 359/15 |
| 2002/0001109 A1 | * | 1/2002 | Hamano et al. | 359/9 |
| 2002/0018197 A1 | * | 2/2002 | Suzuki | 355/403 |
| 2003/0227657 A1 | * | 12/2003 | Naulleau | 359/15 |

OTHER PUBLICATIONS

H. Dammann, 'Blazed synthetic phase–only holograms', Optik, vol. 31, No. 1, 1970, pp. 95–104.*

Naulleau, P. et al., "Characterization of the accuracy of EUV phase–shifting point diffraction interferometry", SPIE, vol. 3331, pp. 114–123.

White, D.L. et al., "Modification of the coherence of undulator radiation", Rev. Sci. Instrum., 66 (2), Feb. 1995, pp. 1930–1933.

* cited by examiner

Primary Examiner—Thong Nguyen
Assistant Examiner—Arnel C. Lavarias
(74) Attorney, Agent, or Firm—Fliesler Meyer LLP

(57) ABSTRACT

The effective coherence of a synchrotron beam line can be tailored to projection lithography requirements by employing a moving holographic diffuser and a stationary low-cost spherical mirror. The invention is particularly suited for use in an illuminator device for an optical image processing system requiring partially coherent illumination. The illuminator includes: (1) a synchrotron source of coherent or partially coherent radiation which has an intrinsic coherence that is higher than the desired coherence, (2) a holographic diffuser having a surface that receives incident radiation from said source, (3) means for translating the surface of the holographic diffuser in two dimensions along a plane that is parallel to the surface of the holographic diffuser wherein the rate of the motion is fast relative to integration time of said image processing system; and (4) a condenser optic that re-images the surface of the holographic diffuser to the entrance plane of said image processing system.

30 Claims, 2 Drawing Sheets

HOLOGRAPHIC ILLUMINATOR FOR SYNCHROTRON-BASED PROJECTION LITHOGRAPHY SYSTEMS

The U.S. Government has certain rights in this invention pursuant to Contract No. DE-AC03-76SF00098 between the United States Department of Energy and the University of California for the operation of the Lawrence Berkeley National Laboratory.

FIELD OF THE INVENTION

EUV lithography (EUVL) is an emerging technology in the microelectronics industry. It is one of the leading candidates for the fabrication of devices with feature sizes of 70 nm and smaller. Synchrotron radiation facilities provide a convenient source of EUV radiation for the development of this technology. This invention relates to techniques for generating partially coherent radiation and particularly for converting effectively coherent radiation from a synchrotron to partially coherent extreme ultraviolet radiation suitable for projection photolithography.

BACKGROUND OF THE INVENTION

In general, lithography refers to processes for pattern transfer between various media. A lithographic coating is generally a radiation-sensitized coating suitable for receiving a cast image of the subject pattern. Once the image is cast, it is indelibly formed in the coating. The recorded image may be either a negative or a positive of the subject pattern. Typically, a "transparency" of the subject pattern is made having areas which are selectively transparent or opaque to the impinging radiation. Exposure of the coating through the transparency placed in close longitudinal proximity to the coating causes the exposed area of the coating to become selectively crosslinked and consequently either more or less soluble (depending on the coating) in a particular solvent developer. The more soluble (i.e., uncrosslinked) areas are removed in the developing process to leave the pattern image in the coating as less soluble crosslinked polymer.

Projection lithography is a powerful and essential tool for microelectronics processing and has supplanted proximity printing. "Long" or "soft" x-rays (a.k.a. Extreme UV) (wavelength range of 10 to 20 nm) are now at the forefront of research in efforts to achieve smaller transferred feature sizes. With projection photolithography, a reticle (or mask) is imaged through a reduction-projection (demagnifying) lens onto a wafer. Reticles for EUV projection lithography typically comprise a glass substrate coated with an EUV reflective material and an optical pattern fabricated from an EUV absorbing material covering portions of the reflective surface. In operation, EUV radiation from the illumination system (condenser) is projected toward the surface of the reticle and radiation is reflected from those areas of the reticle reflective surface which are exposed, i.e., not covered by the EUV absorbing material. The reflected radiation is re-imagined to the wafer using a reflective optical system and the pattern from the reticle is effectively transcribed to the wafer.

A source of EUV radiation is the laser-produced plasma EUV source, which depends upon a high power, pulsed laser (e.g., a yttrium aluminum garnet ("YAG") laser), or an excimer laser, delivering 500 to 1,000 watts of power to a 50 μm to 250 μm spot, thereby heating a source material to, for example, 250,000 C, to emit EUV radiation from the resulting plasma. Plasma sources are compact, and may be dedicated to a single production line so that malfunction does not close down the entire plant. A stepper employing a laser-produced plasma source is relatively inexpensive and could be housed in existing facilities. It is expected that EUV sources suitable for photolithography that provide bright, incoherent EUV and that employ physics quite different from that of the laser-produced plasma source will be developed. One such source under development is the EUV discharge source.

EUV lithography machines for producing integrated circuit components are described for example in Tichenor et al. U.S. Pat. No. 6,031,598. Referring to FIG. 4, the EUV lithography machine comprises a main vacuum or projection chamber 2 and a source vacuum chamber 4. Source chamber 4 is connected to main chamber 2 through an airlock valve (not shown) which permits either chamber to be accessed without venting or contaminating the environment of the other chamber. Typically, a laser beam 30 is directed by turning mirror 32 into the source chamber 4. A high density gas, such as xenon, is injected into the plasma generator 36 through gas supply 34 and the interaction of the laser beam 30, and gas supply 34 creates a plasma giving off the illumination used in EUV lithography. The EUV radiation is collected by segmented collector 38, that collects about 30% of the available EUV light, and directed toward the pupil optics 42. The pupil optics consists of long narrow mirrors arranged to focus the rays from the collector at grazing angles onto an imaging mirror 43 that redirects the illumination beam through filter/window 44. Filter 44 passes only the desired EUV wavelengths and excludes scattered laser beam light in chamber 4. The illumination beam is then reflected from the relay optics 46, another grazing angle mirror, and then illuminates the pattern on the reticle 48. Mirrors 38, 42, 43, and 46 together comprise the complete illumination system or condenser. The reflected pattern from the reticle 48 then passes through the projection optics 50 which reduces the image size to that desired for printing on the wafer. After exiting the projection optics 50, the beam passes through vacuum window 52. The beam then prints its pattern on wafer 54.

Although no longer under serious consideration for high-volume commercial fabrication applications, synchrotron sources play an extremely important role in the development of EUV lithography technology. Being readily available, highly reliable, and efficient producers of EUV radiation, synchrotron radiation sources are well suited to the development of EUV lithography. These sources are currently used for a variety of at-wavelength EUV metrologies such as reflectometry, interferometry and scatterometry.

In the case of synchrotron radiation sources, there are three types of sources: bending magnets, wigglers, and undulators. In bending magnet sources, the electrons are deflected by a bending magnet and photon radiation is emitted. Wiggler sources comprise a so-called wiggler for the deflection of the electron or of an electron beam. The wiggler includes a multiple number of alternating poled pairs of magnets arranged in a series. When an electron passes through a wiggler, the electron is subjected to a periodic, vertical magnetic field; the electron oscillates correspondingly in the horizontal plane. Wigglers are further characterized by the fact that no coherency effects occur. The synchrotron radiation produced by a wiggler is similar to that of a bending magnet and radiates in a horizontal steradian. In contrast to the bending magnet, it has a flow that is reinforced by the number of poles of the wiggler.

Finally, in the case of undulator sources, the electrons in the undulator are subjected to a magnetic field with shorter periods and a smaller magnetic field of the deflection pole than in the case of the wiggler, so that interference effects of synchrotron radiation occur. Due to the interference effects, the synchrotron radiation has a discontinuous spectrum and radiates both horizontally and vertically in a small steradian element, i.e., the radiation is strongly directed.

In lithographic applications, the partial coherence of the illumination (sigma) is often defined as the ratio of the illumination angular range to the numerical aperture of the imaging (projection optical) system. The illumination angular range is also referred to as the divergence of the source. Undulator radiation is much like a laser source in that it produces highly-coherent light of very low divergence. A typical EUV undulator beamline produces a sigma of less than 0.1 whereas lithographic application nominally require a sigma of 0.7 or higher. Although less coherent than undulator radiation, bending magnet radiation is also typically too coherent to be directly used for lithography.

As EUV lithography technology matures, more lithographic printing stations will be required for resist and process development. Proliferation of these systems has, however, been slowed by the lack of reliable and cost-effective EUV sources. It would be greatly desirable to alleviate the dearth of EUV sources for lithographic process development applications in the form of small-field static microsteppers through the use synchrotron radiation. The relatively high coherence of these sources, however, has precluded them from being used more extensively for actual lithography studies. Relevant process development applications require much more incoherence than is inherently provided by synchrotron sources. This is especially true of undulator sources that otherwise would be highly desirable for their large EUV power capabilities.

SUMMARY OF THE INVENTION

The present invention is directed to a lithographic illuminator that illuminates a reticle with EUV radiation emanating from a range of angles. Additionally, light at a particular illumination angle is incoherent with respect to light at all other illumination angles. This condition is achieved by scattering a beam of coherent light with a moving diffuser. Scatter from the diffuser creates the requisite angles of illumination and motion of the diffuser guarantees the mutual incoherence of all these angles, assuming that the observation (or exposure) time to be long relative to the speed of motion.

The major difficulty with conventional diffuser methods lies in fabricating the EUV diffuser. Intrinsic roughness caused by the processing involved in creating the custom relief substrate, tends to increase the scattering angle significantly above the angle desired for typical EUV systems. Most EUV systems have numerical apertures ranging from 0.1 to 0.3; assuming a conventional coherence factor of 0.7 and magnification of 4, the diffuser would ideally have a scattering numerical aperture of approximately 1 degree. Uncontrolled roughness in a diffuser will typically scatter light over an angle of 10 degrees, leading to a two-dimensional loss factor of about 100 due to area effects. An additional loss factor of approximately 10 or larger would also be expected due to loss of multilayer reflectivity. These losses would have a dramatic effect on the optical throughput of the system.

A solution is to employ a holographic diffuser to mitigate the potential high-angle scatter and multilayer reflectivity loss problems. The diffusion is achieved through in-plane spatial modulation of a periodic carrier as opposed to surface profile control. In the simple case of an amplitude hologram, silicon substrates could be used for the multilayer base, essentially eliminating the intrinsic roughness. Binary phase holograms could also be used to improve the diffraction efficiency at the possible cost of higher intrinsic roughness. However, because the binary phase hologram would require fewer steps and a lower overall phase height as compared to a conventional EUV diffuser, the intrinsic roughness could be better controlled. Even higher diffraction efficiency could be obtained through the use of blazed-phase gratings at the possible cost of further increased intrinsic roughness.

In one embodiment, the invention is directed to an illuminator device for an optical image processing system, wherein the image processing system comprises an optical system requiring partially coherent illumination, and where the illuminator includes:

a synchrotron source of coherent or partially coherent radiation which has an intrinsic coherence that is higher than the desired coherence;

a holographic diffuser having a surface that receives incident radiation from said source;

means for translating the surface of the holographic diffuser in at least one dimension along a plane that is parallel to the surface of the holographic diffuser wherein the rate of the motion is fast relative to integration time of said image processing system; and a condenser optic that re-images the surface of the holographic diffuser to the entrance plane of said image processing system.

Typically, the coherent or partially coherent radiation is diffracted by the surface of the holographic diffuser to generate diffracted radiation containing diffracted orders of radiation and a zero order of radiation and the illuminator further comprises filtering means to block at least the zero order radiation from reaching the condenser optic. Preferably, the filtering means allows only the +1 order radiation or −1 order radiation to reach the condenser optic.

In another embodiment, the invention is directed to a method of modifying the coherence of a beam of radiation from a synchrotron source that includes:

(a) directing the beam of radiation onto a surface of a holographic diffuser;

(b) translating the surface of the holographic diffuser in at least one dimension wherein the rate of the motion is fast relative to the subsequent observation time; and (c) re-imaging the holographic diffuser surface to an observation plane.

In a preferred embodiment of the inventive method, translating the holographic diffuser causes the surface to move only linearly within the plane of the holographic surface with the proviso that the surface is not rotated.

DETAILED DESCRIPTION OF THE PREFERRED EMBODIMENTS

Figure 1:
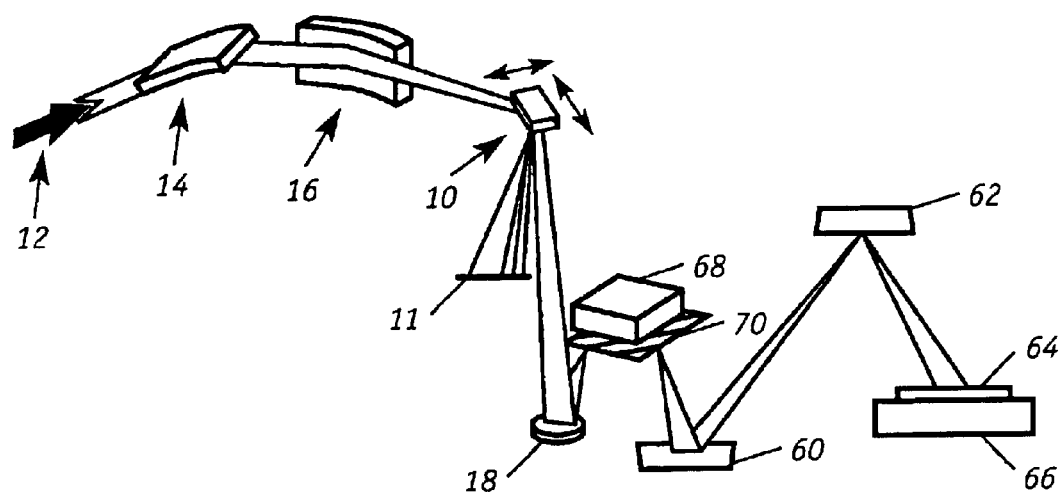
FIGS. 1 and 2 illustrate a configuration of the synchrotron based illuminator.
Figure 2:
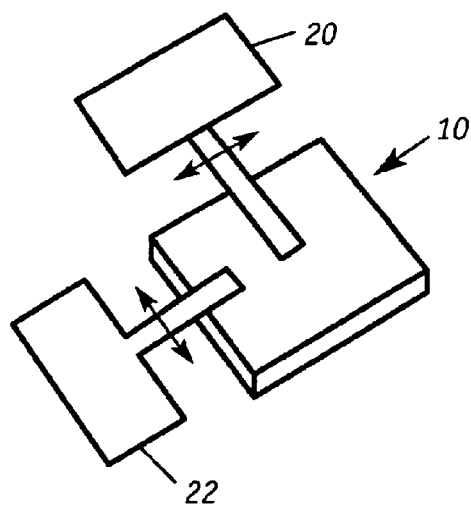

FIG. 1 shows a schematic of the preferred embodiment of the illuminator wherein an effectively coherent synchrotron radiation beam 12 is delivered to moving holographic diffuser 10 by way of conventional beamline optics 14,16. The moving holographic diffuser redirects the beam towards relay mirror 18. As shown in FIG. 2, the movement of holographic diffuser 10 can be controlled by translation mechanisms 20, 22 such that the holographic diffuser 10 is able to be translated linearly in the plane of the holographic surface. The speed of this translation should be rapid enough such that many, preferably about 1000 or more, correlation lengths of the holographic diffuser are spanned during the imaging systems exposure, or integration, time. These translation mechanisms could consist of commercially available x-y stages. For a typical EUV application with a 0.20 numerical aperture projection lithography optic (resolution approximately 40 nm), a desired partial coherence (sigma) of 0.7, and a condenser demagnification of 5, the coherence or correlation length of the diffuser should be approximately 286 nm. If an exposure time of 1 second is assumed, the required holographic diffuser translation speed would be approximately 286 µm per second.

A holographic diffuser is essentially a holographically encoded representation of a conventional diffuser or scatter plate. In the realm of visible-light optics, conventional diffusers most often take the form of ground or etched glass. When light propagates through the device it incurs a spatially varying random phase shift due to the spatially varying random glass thickness. Because glass is essentially transparent at visible light wavelength, the amplitude of the light is not effected by the transmission through the glass, making the ground glass a pure phase device. Typical diffusers have random phase distributions that are uniformly distributed from 0 to $2\pi$. Fabrications of direct analogs to ground glass for use at EUV wavelengths has significant drawbacks due to the high attenuation imparted by all effective phase shift materials at EUV wavelengths. Additionally, this is challenging from a fabrication point of view since three-dimensional lithography of esoteric materials would be required.

The holographic diffuser overcomes these problems by affecting the phase through a diffractive process instead of a refractive process. In the holographic diffuser the desired random or pseudo-random phase pattern is encoded into line positions, or phase, of a carrier grating. The local temporal phase of the light diffracted from a grating type structure is directly proportional to the local spatial phase of the grating itself. Analogous to propagating through ground glass, by propagating light through a periodic spatial carrier structure with randomly varying the spatial phase, the resulting diffracted beams of light will incur spatially varying random phase shifts.

As is evident, a holographic diffuser can be viewed simply as a grating with random phase modulation. The underlying grating may take on various forms including the traditional binary amplitude transmission grating. For higher efficiency, one could also employ a transmission phase grating, such as described for operations at EUV wavelengths in Naulleau, "Phase-shifting point diffraction interferometer phase grating designs", U.S. Pat. No. 6,266,147. Using transmission gratings, however, has several drawback at EUV wavelengths including fabrication difficulties and efficiency losses due to the absorption in both the requisite membrane onto which the grating must be fabricated and in the phase grating case the absorption imparted by the phase shift material.

Figure 3:
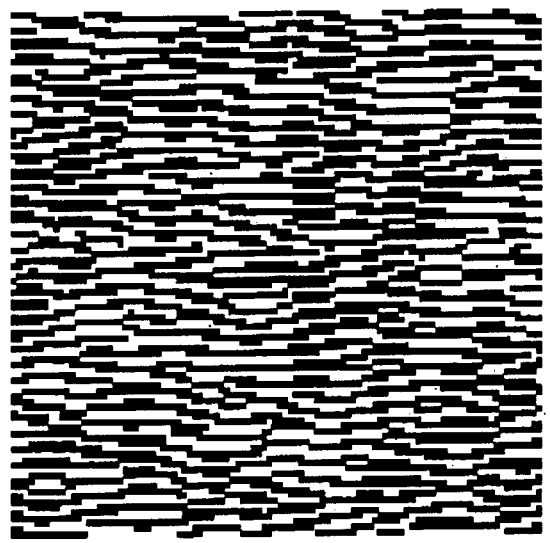
FIG. 3 depicts a typical random phase modulated grating (holographic diffuser)
Figure 4:
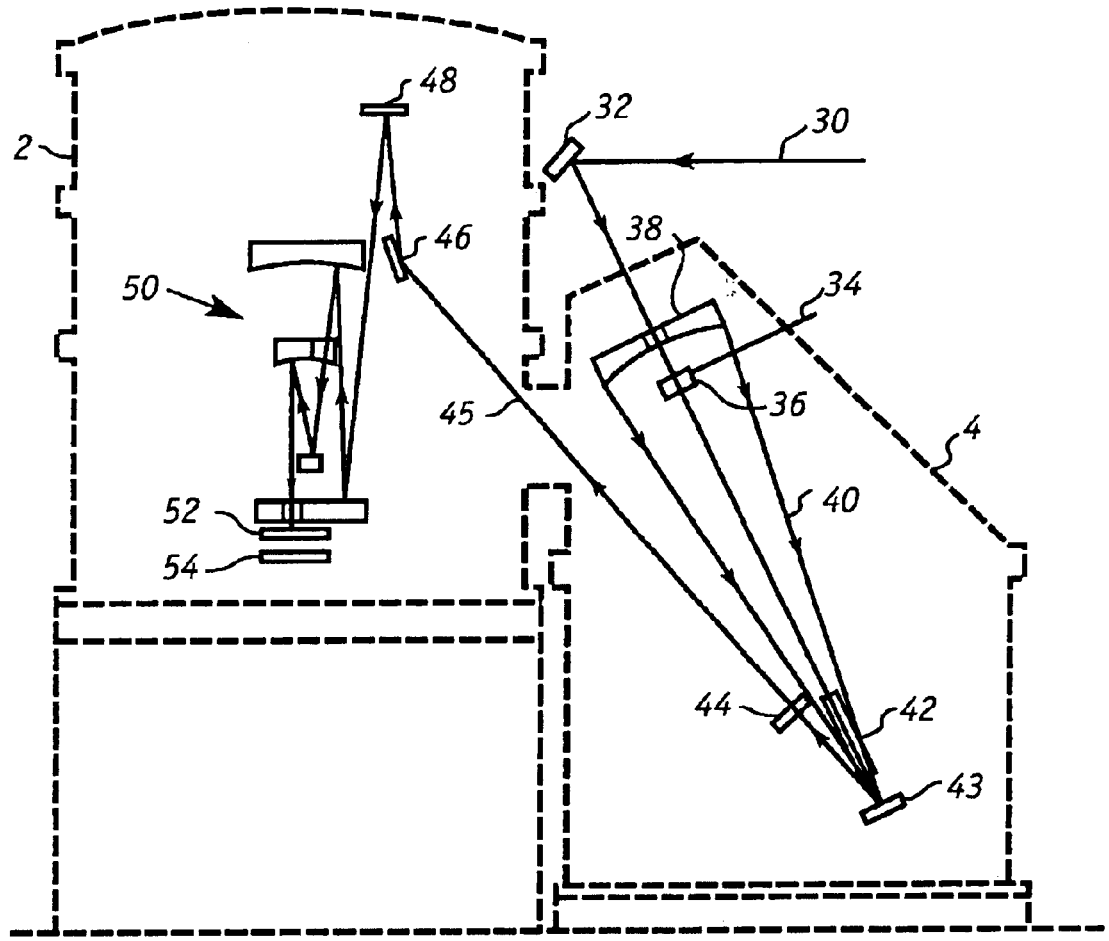
FIG. 4 illustrates a prior art EUV lithography machine.

These problems can be overcome by utilizing reflection grating instead of transmission gratings. Again the underlying reflection grating can take on various forms, for example, binary amplitude or phase gratings as well as blazed phase gratings. Again, the advantage of using phase gratings, especially blazed phase gratings is the tremendous improvement in diffraction efficiency. Preferred blazed phase devices are quantized to between 3 and 8 levels. Fabrication of the reflective phase grating could be achieved, for example, by methods described in Naulleau, "Method of Fabricating Reflection Mode EUV Diffraction Elements", U.S. patent application Ser. No. 09/730,970, filed Dec. 5, 2000, and Anderson, et al. "Method of Fabricating Reflection-Mode EUV Diffusers", U.S. patent application Ser. No. 09/846,150, filed Apr. 30, 2001, which are incorporated herein by reference. As noted above, the random phase characteristics imparted by the holographic diffuser only manifest in the diffracted orders, thus, diffraction efficiency of the carrier grating is of utmost importance. FIG. 3 illustrates a typical random phase modulated grating (holographic diffuser). In the case of a reflection phase carrier grating, black and white regions would represent two different heights, respectively, leading to a relative phase shift of pi between the two regions. For example, at the EUV wavelength of 14 nm and near-normal use, the height difference would be approximately 3.5 nm.

To fabricate an EUV holographic diffuser, this profile structure would be fabricated into a substrate that is subsequently coated with an EUV reflection multilayer. Upon reflection from the device, the proper relative phases would be imparted to the EUV light based on the geometry of the profile patterned into the substrate.

In order for the desired coherence modification to be achieved, the holographic diffuser must move quickly relative to the observation (exposure) time. Without the motion, the diffuser would create the requisite multiple angles of illumination, however, the light at each one of these illumination angles would remain mutually coherent with the light at other angles because they are all derived from a single coherent beam. Incoherence requires both multiple angles of incidence and mutual incoherence of all these angles. This effect can be effectively achieved by motion of a diffuser. In the case of the holographic diffuser, however, the diffuser cannot simply be rotated as is typically done with conventional diffusers because this would cause the carrier to rotate in space. Instead, the holographic diffuser must be translated in x and y only, that is, the surface of the holographic diffuser is not rotated. The speed of this translation should be rapid enough such that many, preferably about 1000 or more, correlation lengths of the holographic diffuser are spanned during the imaging systems exposure, or integration, time. As is apparent, the desired range of angles is inherently generated by the holographic diffuser itself and angular motion as described in Naulleau "Apparatus for Generating Partially Coherent Radiation", U.S. patent application Ser. No. 09/944,391, filed Aug. 30, 2001, which is incorporated herein by reference, is not required. Instead, linear motion is required to decorrelate the different angles produced by the holographic diffuser thereby modifying the coherence of the beam. In U.S. patent application Ser. No. 09/944,391, mutual incoherence of the multiple illumination angles is guaranteed through temporal multiplexing of said angles, whereas for the holographic-diffuser-based illuminator presented here, mutual incoherence is guaranteed random (or pseudo random) phase modulation of the temporally coexisting multiplicity of illumination angles.

The use of a holographic diffuser instead of a conventional diffuser presents two challenges. The first is the presence of the zero order which must be eliminated prior to illuminating the reticle 70 and the second is the increased spatial resolution demands on the lithography. The spatial carrier in the holographic diffuser has the effect of increasing the resolution requirements by, at least, a factor of 4. Both these limitations can be overcome by implementing a demagnifying spatial-filtering system after the holographic diffuser. The demagnifying system can comprise a simple spherical relay mirror 18 used to re-image the diffuser to the reticle. The spatial filtering is provided by a spatial filter or stop 11 that is positioned between the diffuser and the spherical mirror that selects only the one holographic order of interest. Order separation is achieved in the stop plane by properly choosing the spatial-carrier frequency in the holographic diffuser and having the incoming illumination beam focused to the stop plane. As depicted in FIG. 1, the spatial filter 11 can be designed to also block other diffracted orders, e.g., −1 and/or +1, in addition to the zero order; in this case, the −1 order is also eliminated. The spatial filter can be made of an EUV absorbing material.

Because the demagnifying system reduction ratio has an inverse effect on numerical aperture, the numerical aperture required of the holographic diffuser is, in fact, smaller than the illumination numerical aperture sought at the reticle. This has the effect of relaxing the holographic diffuser fabrication resolution requirements. For the 0.2 numerical aperture EUV lithography projection optic example presented above with a 5× reduction condenser, the patterning resolution required to fabricate the diffuser would be approximately 71 nm, which is well within the capabilities of modem electron-beam lithography. The relay mirror 18 function is preferably provided by a single conventional concave spherical mirror, whose surface forms part of a sphere. Although the embodiments described herein employ spherical mirrors for convenience and economical concerns, it is intended that other mirrors be covered by the present invention, such as toroidal, and conic section, e.g., parabolic, hyperbolic, general aspheric, elliptical, cylindrical, etc., mirrors which may be substituted for spherical mirrors within tolerable industry standards, including those with minor flaws or aberrations. Also, the function of the single element relay mirror 18 could also be provided by a more complex multi-element optical system.

In the case of a "critical" illumination system as shown in FIG. 1, spherical relay mirror 18 is an imaging mirror that re-images the holographic diffuser 10 onto reticle 70 which is mounted on reticle stage 68. From the reticle, the reflected pattern is focused by projection optics 60, 62 onto the surface of wafer 64, which is mounted on wafer stage 66. The projection optics can comprise a lithographic optic, which is known in the art. Suitable lithographic optics are described in Hudyma et al. U.S. Pat. Nos. 6,226,346, 6,188, 513, 6,072,852 and 6,033,079 which are incorporated herein by reference.

For lithographic applications, the illumination that is produced by the holographic diffuser 10 typically has a partial coherence (sigma) that ranges from about 0.3 to 1; for many applications the illumination has a partial coherence of about 0.7.

A preferred source of the coherent or partially coherent radiation is a synchrotron radiation source, which is a broadband source capable of operating from the X-ray through infrared regimes. The synchrotron is constructed from a storage ring providing for relativistic electrons or positrons confined by magnetic fields to a repeating orbital path. A suitable source is the synchrotron undulator beamline source (CXRO beamline 12.0.1.2 at the Advanced Light Source, Lawrence Berkeley National Laboratory) operating at a wavelength of 13.4 nm with a bandwidth $\lambda/\Delta\lambda$ of about 200.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A lithographic illuminator device for an optical image processing system, wherein the image processing system comprises an optical system requiring partially coherent illumination, and where the illuminator comprises:

a synchrotron source of coherent or partially coherent extreme ultraviolet (EUV) radiation which has an intrinsic coherence that is higher than the desired coherence;

reflective optics that recieves incident EUV radiation from said synchrotron source;

a single holographic diffuser, that comprises a reflection grating, having a surface that receives incident EUV radiation from said reflective optics wherein the holographic diffuser is a blazed phase device;

means for translating the surface of the holographic diffuser linearly in two dimensions along a plane that is parallel to the surface of the holographic diffuser with the proviso that the surface of said holographic diffuser is not rotated, wherein the rate of the motion is fast relative to integration time of said image processing system wherein the coherent or partially coherent radiation is diffracted by the surface of the holographic diffuser to generate diffracted radiation containing diffractive orders of radiation and a zero order of radiation;

a condenser optic that re-images the surface of the holographic diffuser to the entrance plane of said image processing system such that a reticle which is positioned at the entrance plane is illuminated with EUV radiation emanating from a range of angles and wherein EUV radiation at a particular illumination angle is incoherent with respect to EUV radiation at all other illumination angles; and filtering means to block at least the zero order radiation from reaching the condenser optic.

2. The illuminator of claim 1 wherein the filtering means also blocks all but the +1 order radiation or the −1 order radiation from reaching the condenser optic.

3. The illuminator of claim 1 wherein the holographic diffuser is a binary amplitude device.

4. The illuminator of claim 1 wherein the holographic diffuser is a binary phase device.

5. The illuminator of claim 1 wherein the holographic diffuser blaze is quantized to between 3 and 8 levels.

6. The illuminator of claim 1 wherein the condenser optic is a single reflective element.

7. The illuminator of claim 6 wherein the reflective condenser element is spherical.

8. A method of modifying the coherence of a beam of extreme ultraviolet (EUV) radiation from a synchrotron source that comprises:

(a) positioning a reflective optics that receives incident EUV and directing a beam of radiation from the reflective optics onto a surface of a single holographic diffuser, that comprises a reflection grating, wherein the holographic diffuser is a blazed phase device;

(b) translating the surface of the holographic diffuser in two dimensions causing the surface to move only linearly in the plane of the holographic surface with the proviso that the surface is not rotated, wherein the rate of the motion is fast relative to the subsequent observation time wherein the beam of radiation comprises coherent or partially coherent radiation that is diffracted by the surface of the holographic diffuser to generate diffracted radiation containing diffracted orders of radiation and zero order of radiation;

(c) re-imaging the holographic diffuser surface to an observation plane, wherein the re-imaging step employs a condenser optic such that a reticle which is positioned at the observation plane is illuminated with EUV radiation emanating from a range of angles and wherein EUV radiation at a particular illumination angle is incoherent with respect to EUV radiation at all other illumination angles; and (d) blocking at least the zero order radiation from reaching the condenser optics.

9. The method of claim 8 wherein the blocking step also blocks all but the +1 order radiation or the −1 order radiation from reaching the condenser optic.

10. The method of claim 8 wherein the holographic diffuser is a binary amplitude device.

11. The method of claim 8 wherein the holographic diffuser is a binary phase device.

12. The method of claim 8 wherein the holographic diffuser blaze is quantized to between 3 and 8 levels.

13. The method of claim 8 wherein the condenser optic is a single reflective element.

14. The method of claim 13 wherein the reflective condenser element is spherical.

15. A lithographic illuminator device for an optical image processing system, wherein the image processing system comprises an optical system requiring partially coherent illumination, and wherein the illuminator comprises:

a synchrotron source of coherent or partially coherent extreme ultraviolet (EUV) radiation which has an intrinsic coherence that is higher than a desired coherence;

reflective optics that receives incident EUV radiation from said synchrotron source;

a single holographic diffuser, that comprises a reflection grating, consisting essentially of a single surface that receives incident EUV radiation from said reflective optics;

means for translating the surface of the holographic diffuser linearly in two dimensions along a plane that is parallel to the surface of the holographic diffuser with the proviso that the surface of said holographic diffuser is not rotated, wherein the rate of the motion is fast relative to integration time of said image processing system wherein the coherent or partially coherent radiation is diffracted by the surface of the holographic diffuser to generate diffracted radiation containing diffractive orders of radiation and a zero order of radiation;

a condenser optic that re-images the surface of the holographic diffuser to the entrance plane of said image processing system such that a reticle which is positioned at the entrance plane is illuminated with EUV radiation emanating from a range of angles and wherein EUV radiation at a particular illumination angle is incoherent with respect to EUV radiation at all other illumination angles; and filtering means to block at least the zero order radiation from reaching the condenser optic.

16. The illuminator of claim 15 wherein the filtering means also blocks all but the +1 order radiation or the −1 order radiation from reaching the condenser optic.

17. The illuminator of claim 15 wherein the holographic diffuser is a binary amplitude device.

18. The illuminator of claim 15 wherein the holographic diffuser is a binary phase device.

19. The illuminator of claim 15 wherein the holographic diffuser is a blazed phase device.

20. The illuminator of claim 19 wherein the holographic diffuser blaze is quantized to between 3 and 8 levels.

21. The illuminator of claim 15 wherein the condenser optic is a single reflective element.

22. The illuminator of claim 21 wherein the reflective condenser element is spherical.

23. A method of modifying the coherence of a beam of extreme ultraviolet (EUV) radiation from a synchrotron source to yield a partially coherent illumination having a desired coherence, said method comprising of:

(a) positioning a reflective optics that receives incident EUV from the synchrotron source of coherent or partially coherent radiation which has an intrinsic coherence that is higher than that of the partially coherent illumination;

directing a beam of radiation from the reflective optics onto a surface of a single holographic diffuser, that comprises a reflection grating, wherein the diffuser consists essentially of a single surface that receives incident radiation from said reflective optics;

(c) translating the surface of the holographic diffuser in two dimensions causing the surface to move only linearly in the plane of the holographic surface with the proviso that the surface is not rotated, wherein the rate of the motion is fast relative to the subsequent observation time wherein the coherent or partially coherent radiation is diffracted by the surface of the holographic diffuser to generate diffracted radiation containing diffractive orders of radiation and a zero order of radiation;

(d) re-imaging the holographic diffuser surface with a condenser optic to an observation plane optic such that a reticle which is positioned at the observation plane is illuminated with EUV radiation emanating from a range of angles and wherein EUV radiation at a particular illumination angle is incoherent with respect to EUV radiation at all other illumination angles; and blocking at least the zero order radiation from reaching the condenser optic.

24. The method of claim 23 wherein the blocking step also blocks all but the +1 order radiation or the −1 order radiation from reaching the condenser optic.

25. The method of claim 23 wherein the holographic diffuser is a binary amplitude device.

26. The method of claim 23 wherein the holographic diffuser is a binary phase device.

27. The method of claim 23 wherein the holographic diffuser is a blazed phase device.

28. The method of claim 27 wherein the holographic diffuser blaze is quantized to between 3 and 8 levels.

29. The method of claim 23 wherein the condenser optic is a single reflective element.

30. The method of claim 29 wherein the reflective condenser element is spherical.

* * * * *